US011961837B2

(12) United States Patent
Chowdhury et al.

(10) Patent No.: US 11,961,837 B2
(45) Date of Patent: Apr. 16, 2024

(54) SEMICONDUCTOR APPARATUSES AND METHODS INVOLVING DIAMOND AND GaN-BASED FET STRUCTURES

(71) Applicants: The Board of Trustees of the Leland Stanford Junior University, Stanford, CA (US); The Regents of the University of California, Oakland, CA (US)

(72) Inventors: Srabanti Chowdhury, San Ramon, CA (US); Mohamadali Malakoutian, Davis, CA (US); Matthew A. Laurent, Rancho Palos Verdes, CA (US); Chenhao Ren, Davis, CA (US); Siwei Li, Davis, CA (US)

(73) Assignees: The Board of Trustees of the Leland Stanford Junior University, Stanford, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 17/571,128

(22) Filed: Jan. 7, 2022

(65) Prior Publication Data

US 2022/0223586 A1 Jul. 14, 2022

Related U.S. Application Data

(60) Provisional application No. 63/135,065, filed on Jan. 8, 2021.

(51) Int. Cl.
*H01L 27/085* (2006.01)
*H01L 21/02* (2006.01)
(Continued)

(52) U.S. Cl.
CPC ...... *H01L 27/085* (2013.01); *H01L 21/02389* (2013.01); *H01L 21/02527* (2013.01);
(Continued)

(58) Field of Classification Search
CPC . H01L 27/085; H01L 27/092; H01L 29/1602; H01L 29/2003; H01L 29/4236;
(Continued)

(56) References Cited

U.S. PATENT DOCUMENTS 7,888,171 B2    2/2011   Korenstein et al.
8,497,513 B2    7/2013   Kohn et al.
(Continued)

FOREIGN PATENT DOCUMENTS

WO    2021/142206 A1    7/2021

OTHER PUBLICATIONS

Yosuke Sasama, Katsuyoshi Komatsu, Satoshi Moriyama, Masataka Imura, Tokuyuki Teraji, Kenji Watanabe, Takashi Taniguchi, Takashi Uchihashi, Yamaguchi Takahide; High-mobility diamond field effect transistor with a monocrystalline h-BN gate dielectric. APL Mater Nov. 1, 2018; 6 (11): 111105.
(Continued)

*Primary Examiner* — Farun Lu
*Assistant Examiner* — Sandra Milena Rodriguez Villanu
(74) *Attorney, Agent, or Firm* — Crawford Maunu PLLC

(57) ABSTRACT

In certain examples, methods and semiconductor structures are directed to an integrated circuit (IC) having a diamond layer section and a GaN-based substrate being monolithically integrated or bonded as part of the same IC. In a specific example, the GaN-based substrate includes GaN, $Al_xGa_yN$ ($0<x<1$; $x+y=1$) and a dielectric layer, and a diamond layer section which may include polycrystalline diamond. The IC includes: a GaN-based field effect transistor (FET) integrated with a portion of the GaN-based
(Continued)

substrate, and a diamond-based FET integrated with a portion of the diamond layer section, the diamond FET being electrically coupled to the GaN-based FET and situated over or against a surface region of the GaN-based substrate.

25 Claims, 11 Drawing Sheets

(51) Int. Cl.
  *H01L 21/8258* (2006.01)
  *H01L 23/00* (2006.01)
  *H01L 23/373* (2006.01)
  *H01L 29/16* (2006.01)
  *H01L 29/20* (2006.01)

(52) U.S. Cl.
  CPC .... *H01L 21/02595* (2013.01); *H01L 21/0262* (2013.01); *H01L 21/8258* (2013.01); *H01L 23/3732* (2013.01); *H01L 24/80* (2013.01); *H01L 29/1602* (2013.01); *H01L 29/2003* (2013.01); *H01L 2224/80203* (2013.01); *H01L 2924/13064* (2013.01); *H01L 2924/13091* (2013.01)

(58) Field of Classification Search
  CPC ............... H01L 29/78; H01L 29/7786; H01L 2924/13064; H01L 2924/13091; H01L 21/02389; H01L 21/02527; H01L 21/02595; H01L 21/0262; H01L 21/8258; H01L 24/80; H01L 2224/80203; H01L 23/3732
  See application file for complete search history.

(56) References Cited

U.S. PATENT DOCUMENTS

| | | | | |
|---|---|---|---|---|
| 2007/0159803 | A1* | 7/2007 | Eskridge | B81B 7/007 257/778 |
| 2011/0108854 | A1* | 5/2011 | Sung | H01L 21/187 257/190 |
| 2015/0155160 | A1 | 6/2015 | Adam | |
| 2015/0315700 | A1* | 11/2015 | Pickles | C23C 16/274 427/575 |
| 2016/0093691 | A1* | 3/2016 | Echigoya | H01L 29/063 257/76 |
| 2017/0018639 | A1* | 1/2017 | Teo | H01L 21/8258 |
| 2018/0266013 | A1* | 9/2018 | Wort | C30B 25/186 |
| 2018/0366936 | A1* | 12/2018 | Kennedy | H02H 3/05 |
| 2019/0237546 | A1* | 8/2019 | Huang | H01L 21/26586 |
| 2019/0360117 | A1 | 11/2019 | Hobart et al. | |
| 2020/0024730 | A1* | 1/2020 | Shikada | B23C 5/16 |
| 2021/0119028 | A1* | 4/2021 | Roizin | H01L 21/0217 |
| 2023/0031266 | A1 | 2/2023 | Chowdhury et al. | |

OTHER PUBLICATIONS

Peterson, R., Malakoutian, M., Xu, X., Chapin, C., Chowdhury, S., & Senesky, D. G. (2020). Analysis of mobility-limiting mechanisms of the two-dimensional hole gas on hydrogen-terminated diamond. Physical Review B, 102(7), 075303.

C. Ren, M. Malakoutian, S. Li and S. Chowdhury, "Hydrogen-terminated diamond FET and GaN HEMT delivering CMOS inverter operation at high-temperature," 2020 Device Research Conference (DRC), Columbus, OH, USA, 2020, pp. 1-2. (Abstract only).

Ren, C. (2020). Studying Integration of Diamond Hole-FET and GaN HEMT as Complementary-FET Inverters for High-Temperature Operation (Doctoral dissertation, University of California, Davis).

Malakoutian, M., Laurent, M. A., & Chowdhury, S. (2019). A study on the growth window of polycrystalline diamond on Si3N4-coated N-polar GaN. Crystals, 9(10), 498.

Harshad Surdi, Maitreya Dutta, Srabanti Chowdhury, "Demonstration of H-Terminated Single Crystal Diamond Hole-Channel MESFET with ~40mA/mm and 121 kV/cm", Electronics Materials Conference (EMC), South Bend, Indiana, Jun. 2017 (Abstract).

The Examiner is respectfully referred to copending patent prosecution of the common Applicants, U.S. Appl. No. 17/790,675, filed Jul. 1, 2022 (published as US-2023-0031266-A1).

* cited by examiner

|  | Diamond hole-FET | GaN HEMT |
|---|---|---|
| source-to-gate (μm) | 2 | 1 |
| drain-to-gate (μm) | 8 | 21 |
| gate-length (μm) | 4 | 4 |
| channel-width (μm) | 60 | 50 |
FIG. 1D
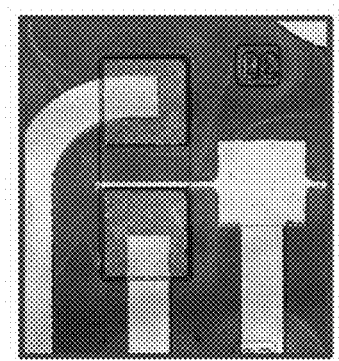
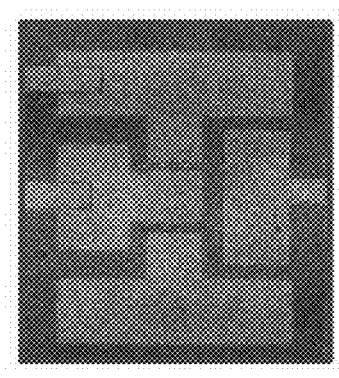
FIG. 1C

SEMICONDUCTOR APPARATUSES AND METHODS INVOLVING DIAMOND AND GaN-BASED FET STRUCTURES

FEDERALLY-SPONSORED RESEARCH AND DEVELOPMENT

This invention was made with Government support under contract D15AP00092 UC grant awarded by the Defense Advanced Research Projects Agency and under contract W911NF-18-2-0017 UC grant awarded by the Office of Naval Research. The Government has certain rights in the invention.

BACKGROUND

Certain aspects of the present disclosure are related generally to the field of semiconductor devices and in some instance may be applicable to and/or used in connection with high power and/or high frequency devices. As discussed further herein, certain aspects of the disclosure are directed to use and integration of diamond and GaN-based (including Gallium-Nitride or GaN) field effect transistors, as may be applied to realize high density and high mobility holes and electrons.

Silicon-based integrated circuits and certain precise electronics require rigorous operational environment stability and impose restrictions on versatile applications, and it is known that wide bandgap semiconductors may tolerate both high-temperature environment and device self-heating issues. As specific examples, diamond and Gallium-Nitride (GaN) demonstrate their electronic functionality at extreme-temperature way beyond the capability of silicon and silicon-on-insulators, and proper implementation of these materials are expected to provide operation of circuits at high-power output and/or at high frequencies.

High-electron mobility transistors (or HEMTs) such as GaN-based FETs have exhibited an extremely high-power output at high frequencies. However, there are some significant limiting factors of the performance in GaN HEMTs, and this may lead to a reduced channel mobility and large leakage current due to self-heating of the semiconductor devices, in which the transistors are formed. Therefore, it may be beneficial to dissipate the generated heat from such devices. Owing to the excellent heat conductivity of certain materials such as diamond which is about 20 W/cm·K, previous efforts have attempted to use such materials to spread the heat from the top of the device. However, in connection with such efforts involving GaN-based FETs, problems have been encountered. For example, in attempting to use a diamond to dissipate the heat from a GaN-based device, it is important to couple the diamond right up against the GaN layer, but such growth can prevent a uniform PCD deposition on the surface, as the hydrogen plasma is etching at the same time.

Also, previous efforts which have used a layer of polycrystalline diamond grown on the GaN layer to spread the heat from the top of the device, due to hydrogen plasma being the main species in diamond growth, result in the growth process damaging the GaN material and thereby changing the properties of the 2-dimensional electron gas (2DEG) associated with operation of such transistors. Changing the 2DEG properties is undesirable, because these properties largely control the switching speeds of the transistors. For example, in certain uses of a HEMT, to turn off a normally-On GaN-based FET, the 2DEG (2 dimensional electron gas) layer is depleted, to permit a negative voltage to be applied between the gate and source of the FET. As in certain known GaN-based FETs, electrons concentrated in a 2DEG layer under the gate may be depleted in this regard, so that current through the FET's underlying GaN layer is effectively reduced.

These and other matters have presented challenges to efficiencies of such methodology and semiconductor-directed implementations, for a variety of applications including devices and methods involving semi-conductive structures that include heat-distributing layers in fast-switching devices such as GaN-based FETs.

SUMMARY OF VARIOUS ASPECTS AND EXAMPLES

Various examples/embodiments presented by the present disclosure are directed to issues such as those addressed above and/or others which may become apparent from the following disclosure. For example, some of these disclosed aspects are directed to methods and devices that use or leverage from the properties of diamond and of GaN-based materials as used, for example, in field-effect transistors (FETs). Other aspects are directed to overcoming previously-used techniques, such as discussed above, in contexts involving GaN-based FETs having a GaN-based layer and a diamond layer section.

In certain example embodiments, the present disclosure is directed to an apparatus (e.g., including or referring to a semiconductor-type device) and/or to a method for using or forming the apparatus. In such a process for example, the method of forming may include the following: forming a GaN-based substrate including GaN, AlGaN and a dielectric layer and a diamond layer section including single crystalline diamond or polycrystalline diamond; and forming an integrated circuit that includes a combination of field effect transistors (FETs). One of the FETs is a GaN-based field effect transistor (FET) integrated with a portion of the GaN-based substrate, and another of the FETs is a diamond-based FET integrated with a portion of the diamond layer section, wherein the diamond FET is electrically coupled to the GaN-based FET and situated over or against a surface region of the GaN-based substrate. Also, interconnects are provided to electrically interconnect the GaN-based FET and the diamond-based FET (e.g., printed circuit traces, wire bonds or metal lines fabricated using lithography techniques). Consistent therewith, such a semiconductor device may include: a GaN-based substrate including GaN, AlGaN and a dielectric layer and a diamond layer section that is single- or poly-crystalline in nature; and an integrated circuit that includes a GaN-based field effect transistor (FET) integrated with a portion of the GaN-based substrate and further includes a diamond FET integrated with a portion of the diamond section, the diamond FET being electrically coupled to the GaN-based FET by interconnects and situated over or against a surface region of the GaN-based substrate.

In certain more specific examples, semiconductor structures are used to form an integrated circuit (IC) having a diamond layer section and a GaN-based substrate. The GaN-based substrate includes GaN and may include AlGaN, where the composition of Al in AlGaN can vary (e.g., in some instances from 0-100%), and a dielectric layer, and a diamond layer section includes polycrystalline diamond (PCD). The IC includes: a GaN-based field effect transistor (FET) integrated with a portion of the GaN-based substrate, and a diamond FET integrated with a portion of the diamond layer section, the diamond FET being electrically coupled to the GaN-based FET and situated over or against a surface region of the GaN-based substrate. The diamond layer section and the GaN-based substrate may be monolithically integrated or bonded to form the IC so as to include both the diamond FET and the GaN-based FET.

In other specific examples which build on the above aspects, the IC may include a GaN-based FET having a plurality of GaN-type FETs. Whether for one or more GaN-type FETs, the diamond layer section is effective for spreading heat while the IC is being operated, and this may be especially important in high-speed and/or high-temperature operations. In further aspects, the methodology includes monolithic integration or thermo-compression bonding to integrate the diamond-based layer and the GaN-based substrate. In such embodiments, the diamond-based layer is characterized as including (e.g., at least predominantly if not completely) diamond particles grown by seeding.

In more specific examples related to the above methodology and/or devices, an apparatus (e.g., device or system) includes such an IC having the diamond FET as a p-channel diamond FET and the GaN-based FET as an n-channel GaN-based HEMT (high-electron-mobility transistor). These FETs may be configured as a complementary FET (or CeFET, akin to a CMOS transistor).

In the above type of apparatus, the IC may include a crystal-diamond-based FET using a surface or sub-surface based, hole channel, or a metal semiconductor FET with p-type channel, a GaN-based HEMT (i.e., high-electron mobility transistor having at least one GaN-type HEMT), and/or may include another type of GaN-based FET alone or among a plurality of GaN-type FETs. During operation, build-up of heat produced by such devices may be spread and thereby controlled by the diamond layer section being integrated over or against the surface region of the GaN-based layer. In this regard, the diamond-based layer serves to dissipate heat developed by the GaN-type FET(s) and also to provide for a diamond FET which may also be an operative part of the same IC.

Yet further, the diamond layer section may be characterized in that the PCD particles are seeded directly over or against the surface region of the GaN-based layer, the pressure being selected to set a targeted grain size, associated with sp$^2$ and hydrogen content in the diamond layer section, and/or the PCD particles being grown under a selected pressure with such growth following formation of the PCD particles.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description and in connection with the accompanying drawings, each in accordance with the present disclosure, in which:

FIG. 1C is a top view of an integrated circuit more specifically showing a top view a diamond-based FET and an exemplary type of GaN-based FET, according to certain exemplary aspects of the present disclosure;

FIG. 1D is a table showing feature dimensions of the FETs of FIG. 1C, according to certain exemplary aspects of the present disclosure;

Figure 1A:
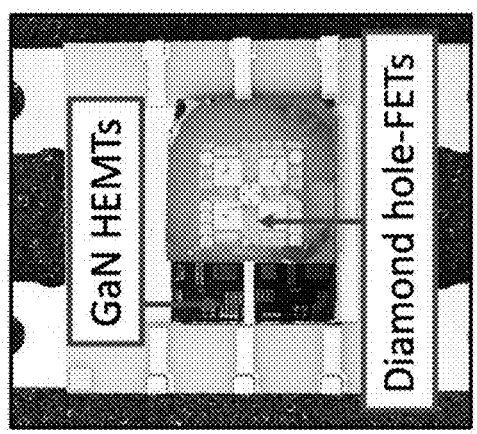
FIGS. 1A and 1B are respective example embodiments of an inverter circuit, according to aspects of the present disclosure.
Figure 1A:
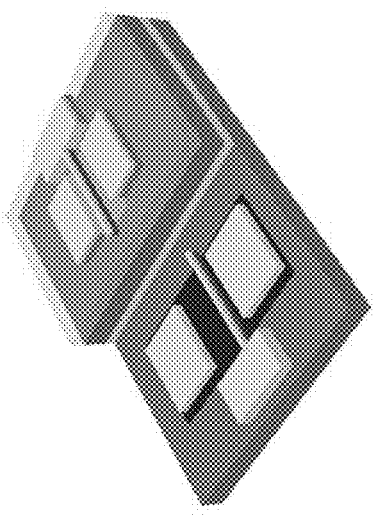

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses and methods involving devices, characterized at least in part by a semi-conductive structure that includes a GaN-based substrate and a diamond layer section, wherein GaN is in at least a surface region of the GaN-based substrate, and the diamond layer and GaN-based substrate are combined, by thermocompression bonding or monolithic integration, to form an integrated circuit (IC) device such as a complementary FET (C-FET). While the present disclosure is not necessarily limited to such aspects, the following description of specific examples may be used to provide an understanding of specific contexts.

According to certain specific examples, aspects of the present disclosure are directed to methods and devices that use or leverage from the benefits of a diamond-based layer used to distribute heat in high-powered and/or fast-switching devices such as one or more GaN-based FETs such as high-electron mobility transistors (HEMTs). Certain examples of such devices include use of a GaN-based substrate as a foundation for both a GaN-type n-channel FET (field effect transistor) and a p-channel diamond FET (channel dominated by hole carriers as opposed to electron carriers). In one specific example of such methods and devices involving configurations of different types of FETs, exemplary aspects of the present disclosure are directed to formation of a C-FET that includes an n-channel GaN-based HEMT and a p-channel diamond FET, implemented via a diamond-based layer, on a common or similarly-constructed GaN-based substrate. Among many other aspects disclosed herein, such aspects are implemented to overcome problems encountered in connection with previous attempts to develop effective fast-switching devices.

Consistent with the above aspects, such a manufactured device or method of such manufacture may involve aspects presented and claimed in U.S. Provisional Application Ser. No. 63/135,065 filed on Jan. 8, 2021 (STFD.429P1), to which priority is claimed. To the extent permitted, such subject matter is incorporated by reference in its entirety generally and to the extent that further aspects and examples (such as experimental and/more-detailed embodiments) may be useful to supplement and/or clarify.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices, systems, methods of use, methods of making, and/or materials (as in the examples hereinabove) may also be found in the Appendices of the above-referenced Provisional. For information regarding details of other embodiments, experiments and/or applications that can be combined in varying degrees with the teachings herein, reference may be made to the teachings and underlying references provided in one or more of the appendices of the above-referenced U.S. Provisional Application and which are fully incorporated herein by reference.

Consistent with the present disclosure, such devices and/or methods may be used for producing, among other examples disclosed herein, various FET types such as: a HEMT, a metal-semiconductor field-effect transistor (MESFET), and a C-FET (e.g., akin to a complementary-metal-oxide-semiconductor or CMOS transistor or inverter). In exemplary aspects consistent with one embodiment of the present disclosure, semi-conducting (IC) structures are constructed by seeding over or on a GaN-based layer to grow diamond (e.g., single or polycrystalline diamond (PCD)) particles and thereby form a PCD layer. The growth is controlled, for example, via a selected pressure and temperature ranges, to form a diamond layer section which is used with the GaN-based layer or substrate in the same IC. The GaN-based substrate may be used to form one or more GaN-based FETs. As examples, the IC may include an n-channel GaN-type FET and a p-channel diamond FET, the latter of which is integrated with the diamond layer section. In this configuration, the diamond layer section is used to spread heat generated by the IC chip during its operation and provide multiple wide-bandgap advantages of materials including properties of GaN-based and diamond-based transistors.

In exemplary aspects consistent with another embodiment of the present disclosure, a PCD layer section is formed separately from the GaN-based layer and, after formation, the PCD layer section and the GaN-based layer are combined by a thermocompression bonding process to form the IC.

As noted above, certain exemplary aspects of the present disclosure may involve methodology and structures which include seeding a GaN-based layer and a PCD layer section. Unless otherwise noted, the GaN-based layer is characterized as including, at least predominantly if not completely, GaN in at least a surface region of the layer.

According to certain more specific examples, aspects of the present disclosure may include method of using and of manufacturing the above types of combined diamond-GaN ICs, and the diamond involved in these devices may be formed so as to have a PCD particle grain size that associated with (e.g., optimized) $sp^2$ and hydrogen content in the diamond layer section. This grain size may be selected and set by application of controlled parameters (e.g., pressures and temperatures) used in the process of growing the PCD particles after they have been seeded.

Further aspects, according to the present disclosure, include one method of forming these PCD particles without the use of chemical vapor deposition, and another method of forming these PCD particles with the use of chemical vapor deposition.

In other specific embodiments, the present disclosure presents a method of using termination of the surface of the diamond layer section, for stabilization, after it is grown, or using an etching process with the diamond layer section used to provide etching protection to the GaN-based layer while patterning for creation of a GaN-type FET.

Consistent with the above aspects and in yet other detailed examples, another aspect of the instant disclosure involves seeding the surface region of a GaN-based layer for development of diamond particles (e.g., PCD particles) on the GaN layer. This method may be used, according to specific examples of the present disclosure, for embodiments directed to monolithically integrating a diamond (e.g., p-channel) FET as one part of an integrated circuit structure and a GaN-based (e.g., HEMT-type) FET as another part of the structure. Moreover, in certain of these detailed examples, such seeding may be on the surface region of a GaN-based layer by locating PCD particles on the GaN layer and using the GaN layer to form the GaN-type FET.

As exemplified in different experimental approaches below, other specific examples involve such ICs, including a GaN-type FET and a diamond FET, respectively implemented via monolithic integration and via thermocompression bonding with the bonding and interconnecting of contact pads so as to minimize contact resistance between the respective pads or terminals of the GaN-type and diamond FETs. In one such specific example involving such monolithic integration, the process may include the diamond layer section and a p-channel diamond FET being formed on a GaN-based substrate and forming an n-channel GaN-based HEMT on a portion of the GaN-based substrate where the diamond layer section is absent (e.g., removed by etching).

In connection with a specific example of such thermocompression bonding process, a substrate for the IC may have two independent portions. One portion may be a GaN-based substrate portion specifically used for forming the GaN-based FET which is integrated with a surface region of a GaN-based substrate portion. Another portion of the IC substrate may be used for forming the diamond layer section for forming a p-channel diamond FET and for helping to mitigate heat during operation of the GaN-based FET. The process may further include forming or applying interconnections at contact pads of the p-channel diamond FET with contact pads of the FET by thermocompression involving a high pressure process carried out at a sufficiently high temperature to join the respective sets of contact pads with acceptably-minimized contact resistance therebetween.

Exemplary experimentally-based examples. Reference is now made to specific experimentally-based examples which are consistent with the above-discussed configuration involving an n-channel GaN-based FET and a p-channel diamond FET and, more particularly, a C-FET including n-channel GaN-based HEMT and p-channel diamond FET (aka diamond hole FET) being implemented on a common or similarly-constructed GaN-based substrate. This specific example takes advantage of diamond and GaN as wide-bandgap semiconductors (providing respectable tolerance to both high-temperature environment and device self-heating) to address the need of certain electronics which demand rigorous operational environment stability. More specifically, diamond and GaN demonstrate their electronic functionality at extreme-temperature way beyond the capability of silicon and silicon-on-insulator. In this experimentation, first demonstrated is a complementary-FET inverter based on monolithic integration of p-channel hydrogen-terminated polycrystalline diamond FET and n-channel GaN HEMT technology. The polycrystalline diamond may be grown via CVD (chemical vapor deposition) on AlGaN/GaN HEMT structure technique for the fabrication of both the diamond device and the GaN device on the same (or similarly-constructed) chip simultaneously. Surprisingly and with impressive results, this specific example experiment used a growth and fabrication processes where a p-channel hydrogen-terminated polycrystalline diamond layer was monolithically grown and preserved on AlGaN/GaN layers without degrading the 2DEG. To ensure the stability of devices at high temperature, approximately 45 nm ALD $Al_2O_3$ were deposited at 450° C. as gate dielectric and passivation for both FETs. Thus, a complementary FET (akin to a "CMOS") inverter was realized using these two wide-bandgap materials with successfully presented operations from 25 to 250° C. This integration method, involving a diamond hole FET and a GaN-based HEMT, provides a pathway basis for manufacturing many types of compact and complex diamond-GaN complementary-FET based integrated circuits.

Such polycrystalline diamond-GaN complementary-FET technology has been experimentally validated via both thermocompression wafer-bonding as well as monolithic integration technology. Via thermocompression wafer-bonding, a thermocompression bonded inverter provides the flexibility to optimize the inverter design and fabrication process. To achieve a monolithically-integrated inverter, this example validation work focused on achieving diamond hole-FET using a polycrystalline diamond layer on AlGaN/GaN structure and then simultaneously fabricating both diamond hole-FET and GaN HEMT on the same chip.

Exemplary Device Structure and Fabrication. Aspects of the monolithically integrated and thermocompression bonded inverters are shown in connection with FIGS. 1A through 1D. Both inverters were based on the AlGaN/GaN-on-silicon substrates. The GaN HEMT was fabricated directly on the AlGaN/GaN structure by thinning the AlGaN layer under the gate for more positive threshold voltages. The PC diamond layer was also grown on the same AlGaN/GaN structure for hydrogen-terminated diamond hole-FET fabrication. The dimensions of the diamond hole-FET and GaN HEMT of the monolithic integrated inverters are shown in FIG. 1D. The GaN HEMT was fabricated on one part of the sample while the diamond hole-FET is adjacent.

Figure 1B:
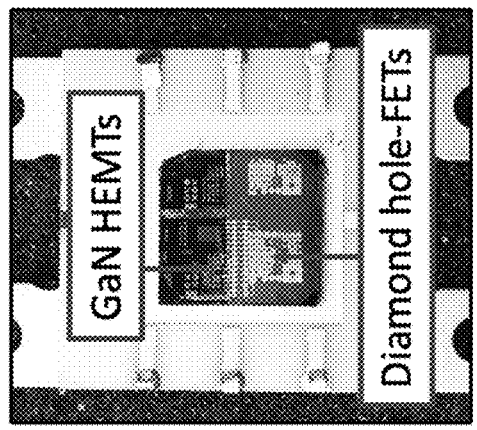
Figure 1B:
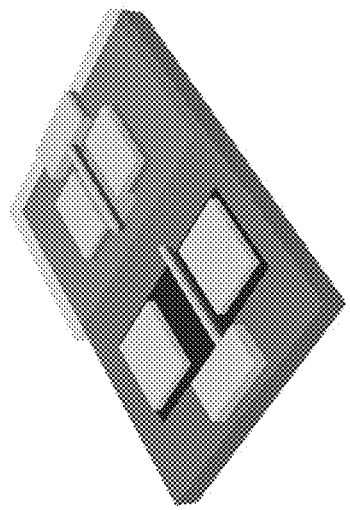

More specifically, FIGS. 1A and 1B show schematic diagrams and top views of the diamond-GaN inverters. In FIG. 1A, the illustrated wafer bonded inverter was achieved by thermocompression bonding polycrystalline diamond hole-FET and AlGaN/GaN-HEMT on different substrates. In FIG. 1B, for the monolithically-integrated polycrystalline diamond and GaN HEMT inverter, two dies were fabricated on the same chip spontaneously with metal interconnections. FIG. 1C shows the top views of diamond hole-FET and GaN HEMT from the monolithic integrated sample, and FIG. 1D is a table showing the dimensions of both FETs from the monolithic integrated inverter. The inverter configure was achieved by metal interconnects.

A thermocompression bonded inverter, for example, based on a diamond hole-FET and GaN HEMT, may be realized to optimize device design and process flow for the monolithic integrated inverter and/or for other purposes. The diamond hole-FETs and GaN HEMTs were fabricated on two identical AlGaN/GaN HEMT substrates. For the diamond hole-FET fabrication, about ~600 nm $SiO_2$ was deposited on top of the substrate as a diamond growth buffer layer. Then, a nucleation layer achieved by a polymer-assisted diamond nanoparticle seeding method. The samples were placed in a microwave plasma CVD chamber (Seki diamond SDS 5000) supplied with a mixture of $CH_4$ and $H_2$ gases. A 1 μm PC diamond layer was grown from the seeds using 1600 W plasma power, 60 Torr pressure, and 700-750° C. temperature for 2 hours. Hydrogen termination of the surface was performed right after the growth with only $H_2$ gas at ~850° C. for 30 min.

Using the top- and cross-sectional-view SEM images of the exemplary CVD-grown diamond as shown in FIGS. 1A, 1B and 1C, recorded hall mobility and sheet-carrier concentration data include 1.42 $cm^2/V\cdot s$ and $6.78\times10^{13}$ $cm^{-2}$ (e.g., using a hall effect measurement system such as Lake Shore 8400). Measured characteristics for PC diamond 2-dimensional-hole-gas (2DHG) on AlGaN/GaN implements the diamond layer as being relatively thin (e.g., less than 4 μm such as between 1-3 μm and, in one example, 1 μm) and with a relatively small grain size (e.g., less than 800 nm such as 500 nm to 950 nm and, in one example, ~600 nm). Thinner diamond is preferred for integration on top of heterostructures like AlGaN/GaN HEMTs to avoid building enormous stress on the channel. The 200 W RIE $O_2$ plasma was applied for device isolation for 5 minutes. The $O_2$ plasma can effectively remove a thin layer of diamond and leave an oxygen terminated surface. The diamond surface (of the diamond layer) is then oxygen terminated and polarized. Adhesive pads (e.g., Ti) may then be deposited on the oxygen terminated diamond surface area for a robust metal-diamond contact. Then, the (e.g., Au) ohmic contacts may be deposited on the top of the adhesive pads and overlapped with the conductive channel. The actual ohmic contact area is relatively small (e.g., less than 500 $\mu m^2$, in a range of 125 $\mu m^2$ to 300 $\mu m^2$, and in one example less than 200 $\mu m^2$ such as 3 μm by 60 μm). By keeping this contact area relatively small in this regard, substrate leakage risk is minimized.

Further, temperature-based approaches for deposition of ALD $Al_2O_3$ (e.g., over temperatures from 200° C. ~500° C.) may be used as both gate dielectric and surface passivation on different diamond hole FETs (or p-channel diamond FET) may provide better uniformity and repeatability in manufacturing. A higher deposition temperature is desired to improve or optimize thermal resistance. In one experimental effort, four single-crystalline (SC) diamond hole-FETs with gate dielectric were deposited at 200, 350, 450, and 500° C. and tested, respectively. The 200~350° C. deposited ALD $Al_2O_3$ provided a repeatable electronic performance up to 225~250° C., though very few devices with large gate-channel length ratio delivered up to 325~350° C. operations for a quick measurement. Most devices of this type started to show a gate leakage current or failures for a long-term measurement above 250° C. The heating-cooling process on multiple measurements also degrades device performance. (Note: In various examples according to the present disclosure, for providing a passivation layer and/or gate dielectric layer over the diamond layer section, the passivation layer and/or gate dielectric layer may include (at least) $Al_2O_3$ or $Si_3N_4$ or $SiO_2$ or $HfO_2$). In connection with such experimentation, before ALD deposition to form the dielectric layer, the sample was kept inside a 450° C. deposition chamber with ~1hPa $N_2$ for 20 minutes to stabilize the substrate temperature. In theory, the surface air dopants tend to de-attach from the surface and lower the total carrier concentration in this process. This phenomenon has been proved by prior studies with 200° C. and 300° C. dielectric depositions. However, the dielectric deposition above 450° C. does not show a low carrier concentration as expected. It is predicted that the hydrogen-terminated diamond channel was formed by a new mechanism that transferred electrons from the diamond conduction band into the dielectric layer directly (see Kawarada, H. Hiraiwa, A. (2014). C—H surface diamond field effect transistors for high temperature (400° C.) and high voltage (500 V) operation. Applied Physics Letters, 105(1), 013510. doi:10.1063/1.4884828). Accordingly, this experimentation reveals that higher deposition temperature provides better stability of the dielectric in high working temperature, but less like atomic layer-by-layer growth. Therefore, a thicker dielectric layer is useful to avoid gate dielectric leakage current or dielectric breakdown. As indicated with certain of this experimentation work, approximately 45 nm $Al_2O_3$ may be selected for the thickness of the dielectric layers based on a balance of the channel's gate leakage and controllability.

On the other hand, the same $Al_2O_3$ passivation on polycrystalline (PC) diamond generally delivers 25~50° C. lower in maximum operating temperature than the SC diamond. For this reason, the higher deposition temperatures are preferred for the further monolithic-integrated diamond hole-FET. In connection with the present disclosure, it has been realized that approximately 30 nm-60 nm (e.g., ~45 nm) ALD $Al_2O_3$ deposited at 450~500° C. applied on PC diamond, reliable performance (e.g., up to 225~250° C.) is successfully provided. Finally, Au deposition is used for gate metal formation. For example, use of 50 nm Al/200 nm Au gate metal may be implemented via deposition.

In one implementation, the GaN-based HEMT(s) are fabricated on a separate sample based on AlGaN/GaN HEMT on silicon structure, and then the GaN-based HEMTs and the diamond FET(s) are interconnected. Through this experimentation, the ohmic contact interface between the thin-film Au and hydrogen-terminated diamonds has been recognized as an obstacle, because the high-temperature deposition process tends to degrade the interface and increase the contact resistance. In certain of the above-noted experimental examples, this issue may be addressed successfully by use of Au deposition, including for example, use of 50 nm Al/200 nm Au gate metal via deposition, and the GaN HEMTs may be fabricated on a separate sample based on AlGaN/GaN HEMT on silicon structure. The ohmic contacts of the HEMT may be formed by a 20 nm Ti/120 nm Al/20 nm Ni/50 nm Au metal deposition followed by an 860° C. annealing in $N_2$ for 30 seconds. The alloy diffuses through the AlGaN layer and reaches the conductive 2DEG channel. Then, the 100 W RIE $Cl_2$ plasma may be applied for device isolation. The same ALD $Al_2O_3$ may be applied on the GaN HEMT as the gate dielectric. Then, the 50 nm. Ni/200 nm Au gate may be deposited.

The thermocompression bonding may be achieved by wafer-level integration. A layer (e.g., about 250 nm) of Au is deposited on one side of the diamond hole-FET and GaN HEMT samples. Then, two samples may be placed together with Au-to-Au contact. The two substrates may then be bonded together by thermocompression (e.g., 175-300 N compression at 125-200° C. for 0.75-1.5 hours and in one specific example, 220 N compression at 150° C. for an hour). The independent devices may then be bonded together as inverters using thermocompression-based Au wire-bonding. Such a thermocompression bonded inverter provides the flexibility to optimize devices and fabrication processes and also provides for independent fabrication of the devices as may be useful for various applications.

In many applications, a monolithically-integrated inverter (e.g., including such a diamond hole-FET and GaN HEMT) may be desired. This may be appreciated in connection with an advantage of the polycrystalline diamond being the flexibility of growth on a different substrate (e.g., a GaN-based substrate). The polycrystalline diamond grown on AlGaN/GaN HEMT structure illustrates the possibility of fabricating both diamond hole-FETs and GaN HEMT on a single chip. Beyond the thermocompression bonding, the monolithic integration allows manufacturing diamond-GaN complementary-FET based IC designs in the industry using currently-available semiconductor manufacturing equipment. The monolithic integrated inverter was developed based on the design of the prior thermocompression bonded inverter. There are additional challenges in monolithic integration: One challenge is the diamond etching process: the diamond is one of the most resistant materials for etching. Based on the design, a window opening on the diamond layer is an essential process. $O_2$ plasma is the main etching gas, which requires a special hard-etching mask. The 400 W ICP and 200 W RIE power in the RIE-ICP system has a non-ideal etching selectivity of diamond and photoresist less than 1:10. The photoresist used in this work only provides a thickness of 2.7 which only sufficient for a delicate diamond etching less than 200 nm. Therefore, a different hard mask is required for diamond etching. The $SiO_2$ and Al were investigated for this purpose.

Another challenge is GaN HEMT ohmic contact annealing: The ohmic contact of GaN requires 30-second annealing in $N_2$ at 860° C. This process could destroy the hydrogen-carbon bonds. Two different process flows were attempted to minimize the potential risk.

Figure 2:
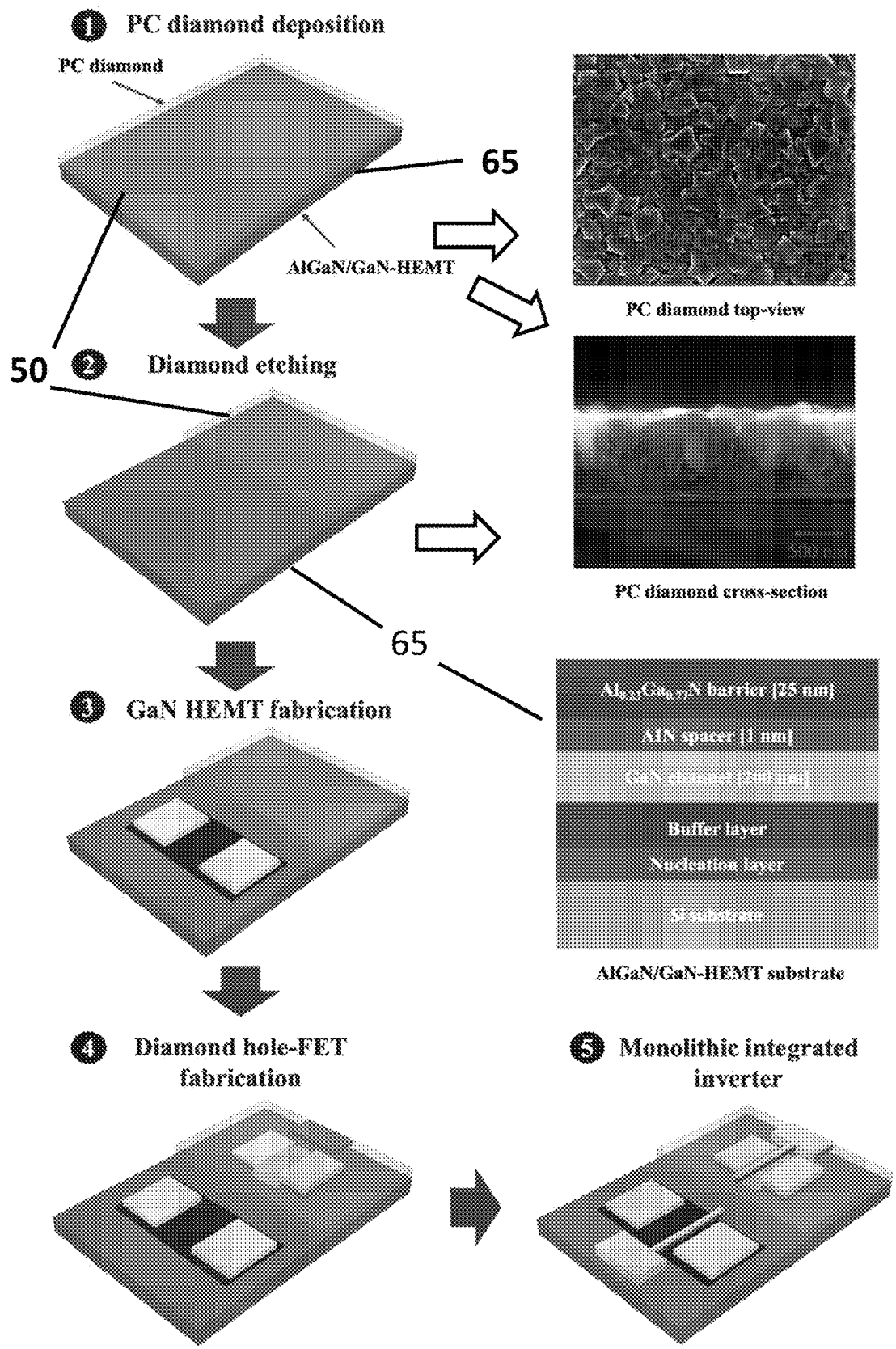
FIG. 2 is a flow chart showing an example process for monolithically integrating, during their fabrication, the FETs of FIG. 1C, according to certain exemplary aspects of the present disclosure.

In FIG. 2, the schematic diagrams demonstrate the process flow of the monolithic integrated inverters. The polycrystalline diamond 50 was first deposited on the top of the AlGaN/GaN HEMT structure, depicted as substrate 65, which is shown in this particular example to include a nucleation layer (for PCD growth), $SiO_2$ buffer layer. A GaN layer in which a GaN channel is formed for a GaN-type FET, an AlN spacer, and an AlGaN barrier layer. The diamond on one side of the substrate was etched by $O_2$ plasma using Al or $SiO_2$ as hard masks. The ohmic contact and isolation of HEMT were performed on the HEMT structure. A 300 nm $SiO_2$ was is deposited on top of the sample to protect the HEMT side. Then, the diamond was hydrogen terminated in MPCVD system for 30 minutes. The Ti/Au ohmic contact and isolation were achieved on the polycrystalline diamond. After approximately 45 nm ALD $Al_2O_3$ depositions at 450° C. as a dielectric, the Ti/Au gate and metal interconnect were deposited together after removing dielectric from ohmic contact pads.

More specifically, FIG. 2 shows the process flow of the monolithically-integrated complementary-FET inverter. With a $SiO_2$ buffer layer on the top of the AlGaN/GaN HEMT substrate, the ~1 μm polycrystalline diamond first was grown on the entire sample. Then, a window was opened on the diamond layer for the GaN HEMT fabrication. The $SiO_2$ and Al hard mask were investigated as a hard mask for diamond etching. The $SiO_2$ layer was deposited directly on polycrystalline diamond using 300° C. PECVD deposition. As the plasma-assisted deposition, the uniformity of the $SiO_2$ on small samples (5×5 mm) has differed from the center area to the edge. Therefore, it leads to the difficulty of estimating the actual thickness for the $SiO_2$ patterning process. Compared to a 300~500 nm $SiO_2$ hard mask, the 50100 nm Al was sufficient to support the thick diamond layer (>1 μm) etching. The lift-off E-beam deposited Al hard mask has better patterning accuracy, low process temperature, and less fabrication process. The Al hard mask was preferred for the diamond etching process.

GaN HEMT fabrication was achieved in the initial design before diamond growth since the Ti/Al/Ni/Au ohmic annealing process can destroy the hydrogen-terminated diamond. After 2 to 3 hours of diamond growth at 700° C., the over annealing of the HEMT ohmic contact was observed. The metal diffused into the channel and surrounding area, which potentially causes substrate leakage current. To avoid over annealing, the ohmic contact and isolation of GaN HEMT were achieved after the diamond growth and window opening. Then, the sample was returned into the MPCVD system for a quick 20-to-30 minutes hydrogen termination. The difficulty of this process was complete removal of the $SiO_2$ or Al hard mask before hydrogen termination. Although alternated wet and dry etching was applied, on the diamond surface some contaminations remains from either $SiO_2$ or Al. To minimize the risk, approximately 100 nm surface diamond was removed to ensure a cleaner diamond surface. However, the sample's mobility and carrier concentrations were still measured on the lower side at 2.47 $cm^2/V\cdot s$ and $7.77 \times 10^{12}$ $cm^{-2}$, respectively.

The same Ti/Au ohmic contact and $O_2$ plasma isolation were applied for the diamond hole-FET side. After approximately 45 nm $Al_2O_3$ ALD deposition at 450° C. and ohmic contact opening, the gates and metal interconnection were deposited simultaneously. Although $SiO_2$ isolation layers were generally preferred, the metal interconnections were temporarily deposited on the ALD dielectric only. The main concern was the risk of losing gate controllability and degrade hole-FET performance during the high-temperature PECVD deposition. However, low-temperature oxide isolation, such as E-beam $SiO_2$ or spin-on-glass, can be used.

The ceramic packages were prepared for high temperatures if needed. The ceramic QFNs package from Strat-Edge Corp. consisted of a high thermal conductivity copper alloy base, 96% $Al_2O_3$ ceramic shell, and lid, which provides relatively controlled thermal conditions minimize device vibrations. The connections between the package pin and the device were applied by Au wire-bonding based on desired measurements, and both inverters are to be placed in the ceramic package (e.g., shell and lid).

Discussion now turns to the measured characteristics and results of this experimentation. The independently-fabricated polycrystalline diamond hole-FET and GaN HEMT were first measured with a parameter analyzer (Keithley 4200), with measurements taken to show the $I_d$-$V_{ds}$ and $I_d$-$V_{gs}$ characteristics of both devices at room temperature (as shown in the underlying U.S. Provisional). The diamond hole-FET delivered an on-off ratio as high as $5 \times 10^7$. In connection with such testing, the diamond FET shows a dielectric breakdown at −156V, and the GaN FET has very low leakage current up to 200V.

Measurements were also taken to show the threshold voltages of the diamond hole-FET from room temperature up to 300° C. (also as shown in the underlying U.S. Provisional). This testing shows that the threshold voltage varies between −0.2 and 0 V from 25 to 300° C., which illustrates the stability of diamond p-FET at high-temperature.

The threshold voltage of different GaN HEMTs was also recorded and compared. With deeper etching under the gate, the GaN HEMT showed more positive threshold voltages. At room temperature, GaN HEMTs with an etching of approximately 24 nm under the gate showed a positive threshold voltage (+0.5 V) at room temperature, which may play an important role in offering a well-behaved diamond-GaN complementary inverter for certain exemplary devices and applications.

Through such experimentation, it was also discovered that the voltage transfer characteristic (VTC) transition width of the inverter depends on the threshold voltage of both HEMT and p-FET. The smaller threshold voltage difference between the two devices provides a sharper on-off VTC transition.

The off-state characteristics of diamond p-FET and GaN HEMT were assessed (as in the above-referenced U.S. Provisional). Both devices were measured at off-state, where the $V_g = V_{th}$. By sweeping the drain voltage from 0 to −200 V for diamond p-FET, a dielectric breakdown was observed at −156V. Its main contributor is the large surface roughness and non-ideal hydrophobic surface for dielectric deposition. GaN HEMTs demonstrated a low leakage current (less than $10^{-7}$ A/mm) during the same measurement with a drain voltage sweeping from 0 to +200 V.

GaN HEMTs in this experimental work demonstrated reliable performance at an even higher temperature. Three different under-gate etching depths were studied to match the drain current density and threshold voltage. At room temperature, the GaN HEMT with different etching depths based on the etching time of 60 sec (~12 nm), 90 sec (~18 nm), and 120 sec (~24 nm) provide the threshold voltages at −3.2V, −2.1V, and +0.5V, and other testing verified the log-scale $I_d$-$V_{ds}$ of the GaN HEMTs under different gate voltages at 400° C. The GaN HEMT with ~24 nm etching shows the lowest off-state current density at high-temperature. Further, the $I_d$-$V_{ds}$ measurements of the diamond p-FET at 300° C. confirm transistor modulation without any degradation to the 2DHG channel.

The layout of the inverter, including p-FET and HEMT, may vary. In one example IC device, VTC measurement, the current density matching plays a significant role in the transition region. The voltage transition happens closer to the FET threshold voltage with a higher current, which is HEMT in this case. The inverter VTC was first measured at room temperature with different drain voltages, with the inverter output reaching the high-state (3 to 7 V) and low-state (0 V) with nearly zero voltage drop. At higher temperatures, the inverter also showed full operation from 25 up to 300° C. Although the wire-bonding was used for this study, metal interconnects can be easily replaced for future processes.

Accordingly, in this experimentation work, monolithic integration of diamond p-FET and GaN HEMT inverter was demonstrated on the same chip. In addition to the above-discussed impressive operational results, it was demonstrated that PC diamond may be deposited on an AlGaN/GaN structure without causing any (noticeable) degradation in GaN HEMT performance. The inverter outperformed in VTC measurements with a wide temperature operating range from 25 to 300° C., which is not achievable with Si-CMOS. The example PC diamond p-FET in this experimentation presented an on-off ratio as high as $5 \times 10^7$ with an excellent threshold voltage stability up to 300° C. The enhancement-mode GaN HEMT demonstrated a +0.5V threshold voltage at room temperature and a reliable device performance above 400° C. Significantly, this integration of diamond and GaN transistor technology demonstrates the viability of providing complementary logic functions for various electronic applications for operations in high temperature and/or harsh environments.

Exemplary aspects of PCD formation. According to further aspects of the present disclosure and in connection with certain other non-limiting experimental-testing, the above-described approaches for diamond-on-GaN construction has realized impressive results by setting the grain size of the PCD particles through specific control over the pressure and temperature. In one such successful embodiment, it has been discovered (in experimental or proof-of-concept efforts) that by increasing the pressure from 40 to 60 torr, there is a slight change in the grain size (130 to 180 nm), while at 80 torr the grain size increases by a factor of ~2 from 60 torr case (180 to 350 nm). PCD with 130, 180, or 350 nm grain size corresponds to a thermal conductivity of 40, 58, or 110 W/m·K, respectively. From the cross-sectional view of SEM micrographs, it can be seen that the thickness and the growth rate of the PCD are increasing by elevating the pressure (or the plasma density). The PCD thickness is ~170 nm for 40 torr, ~250 nm for 60 torr, and ~400 nm for 80 torr pressure.

The grain size determines the surface to volume ratio, which corresponds to the $sp^2$ and hydrogen content. So, to have more $sp^3$ bonding less grain boundaries or larger grain sizes are desired. It can be clearly seen that, by increasing the pressure the Raman spectra exhibits a reasonably sharper diamond peak around 1332 cm$^{-1}$, which confirms lower surface to volume ratio and higher $sp^3$ bonding. In the Raman spectra, there is also some signs of $sp^2$ bonding and the hydrogen from the grain boundaries at around 1120, 1450, and 1560 cm$^{-1}$, which changes slightly with pressure. According to certain experimental results associated with particular embodiments, the larger grain size of the PCD is desired for heat spreading purposes, as the thermal conductivity increases by the grain size. To have a larger grain size and higher $sp^3$ bonding ratio, a higher growth pressure is found to be beneficial or needed.

Certain experimental efforts consistent with the above-disclosed aspects and embodiments were directed to the following specific example aspects. The PCD particles are characterized as having a grain size that is within a range from 650 nanometers having a lower grain size to an upper grain size as high as 2.5 microns in certain examples, and as high as several microns in other examples. In one or more of these experiments, the growth facilitated the monolithic integration of the semi-conductive structure and a structure including the GaN-based layer (e.g., resulting in a remarkably smooth surface).

In more specific experiments consistent with the above-noted one or more of these experiments (wherein the polycrystalline diamond (PCD) particles having a grain size that is within such ranges), the method further includes controlling the growth via certain growth-environment parameters used during the growing process, and these growth parameters include growth under pressure (e.g., 40 torr or in a range from 30 to 70 torr), high-temperature application (e.g., 450° C. plus or minus 10-35%), and at least one cooling stage after such high-temperature application.

In yet further specific experiments consistent with the above-noted one or more of these experiments, a dielectric film or layer, having a thickness in a range from 1 nanometer (nm) to 60 nm), is used between the GaN-based layer and the diamond layer section.

Certain successful experimental efforts and results leading to this disclosure are associated with a more-detailed embodiment and an effective demonstration of H-terminated single crystal diamond hole-channel MESFET with a (total) hole current density of 40 mA/mm. With a high breakdown field (e.g., 10 MV/cm±relative to the semiconductor device) and high carrier velocity ($1.1 \times 10^7$ cm/sec, also ±relative to the semiconductor device), diamond is a strong contender to perform as high power and/or high frequency devices. Diamond also presents a unique property of surface conduction through a hole-accumulation layer created by hydrogen termination. The hole-accumulation layer on the diamond surface is generally achieved by hydrogen plasma treatment of a CVD grown diamond layer on a single crystal diamond. However, this method may need or benefit from a diamond reactor chamber and hydrogen plasma capabilities. In connection with this disclosure, H-termination may be achieved on a Type IIa <100> single crystal diamond substrate using a simple glass tube furnace backfilled with pure hydrogen gas at high temperature of ~850° C. Although Au contacts to hole-accumulation layer on CVD grown diamond layer has been successfully reported, it has been discovered in connection with the work leading to the present disclosure that the adhesion of Au (Gold) contacts to the single crystal diamond was poor and exhibiting inconsistent contact properties. An optimized Pd (Palladium) contact exhibited better adhesion to single crystal H-terminated diamond surface offering low specific contact resistance (6.24 µΩ·cm), short transfer length (0.12 µm) and low contact resistivity (0.124 µΩ·cm$^2$). Hole mobility of 29.5 cm$^2$/V·s at a density of $6 \times 10^{12}$/cm$^2$ was obtained in the channel from Hall measurements. Using the 850° C. hydrogen termination process associated with this disclosure along with Pd-based contacts, successful fabrication and characterization has been hereby realized for H-terminated single crystal diamond MESFETs with a gate length of LG=2 µm. A Pd/Au (e.g., 120 nm-50 nm thick) metal stack was deposited as source and drain contacts and an Al/Au (e.g., 100 nm-50 nm thick) metal stack as a Schottky gate contact, where Al/Au refers to Aluminum/Gold. A maximum current density of 37.2 mA/mm was obtained at VGS=-8 V. A minimum subthreshold slope SS of 586 mV/dec and a transconductance gm of 5.2 mS/mm was obtained. The breakdown voltage was around -121 V in a device with gate to drain separation of 10 µm without any field plating and passivation. These successful experimental efforts, as disclosed herein, impressively demonstrate use of a diamond (or diamond-based) FET presenting around 40 mA/mm hole current density obtained without requiring or involving a CVD grown diamond layer.

Also, according to the present disclosure, using such manufacture-related methodology, various semiconductor structures and/or devices may be characterized as including a GaN-based layer that does not manifest etching damage, and/or a diamond layer may that may be beneficial for spreading heat generated.

Various experimental examples, some of which are discussed hereinbelow, have demonstrated that the above-characterized aspects, structures and methodologies may be used in one or more semiconductive devices to form semiconductor circuits and devices including but not limited to one or a combination of semiconductor structures such as inverters of one or more types including, as examples, HEMT, MESFET, CFET, and/or CMOS, etc., involving high-level power/speed attributes and/or applications.

Figure 3:
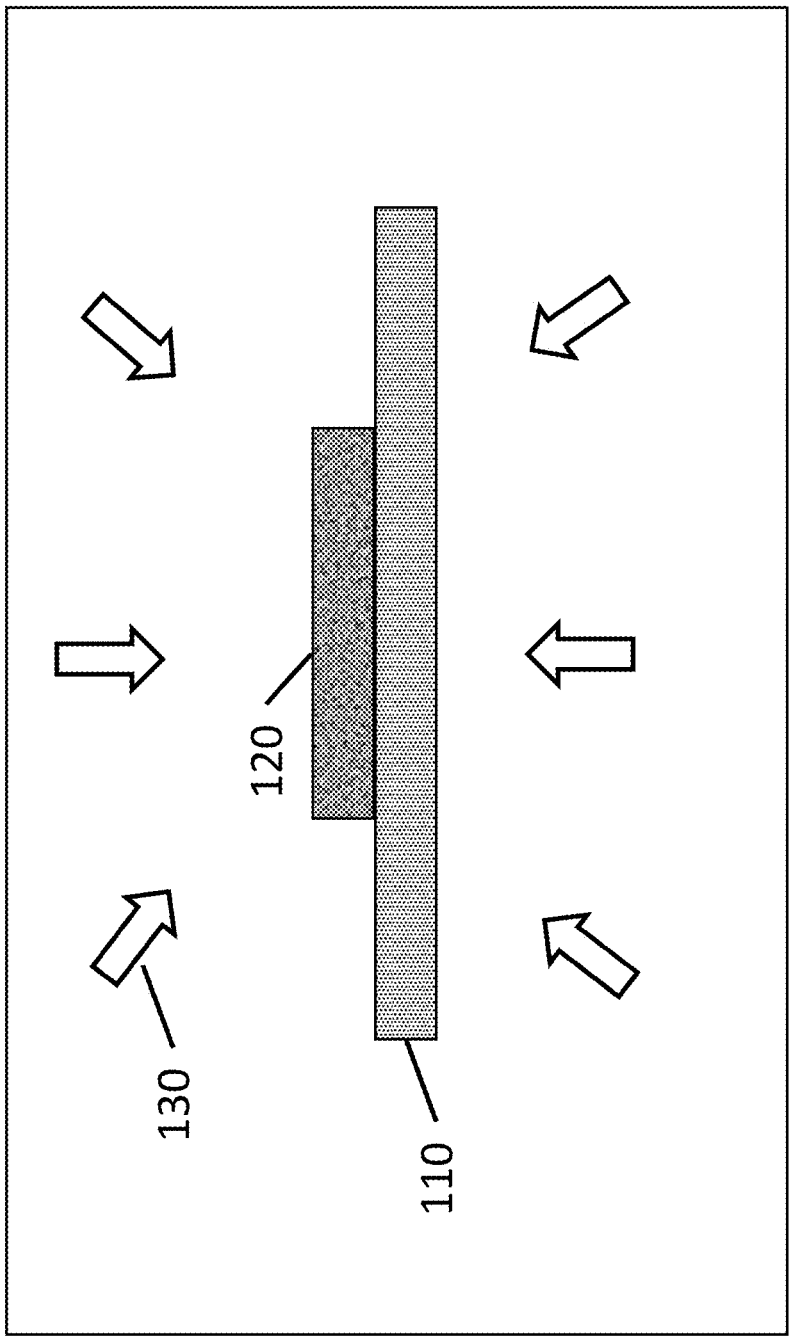
FIG. 3 is diagram illustrating formation of a structure, for example, by seeding and growing PCD particles on an example GaN-based layer while under pressure, according to certain exemplary aspects of the present disclosure.

FIG. 3 is a diagram illustrating seeding and growing PCD particles on a GaN-based layer while under pressure. The GaN-based layer 110 is seeded with PCD particles which may be grown under a selected pressure 130 to form a diamond layer section 120. This provides a semi-conductive structure that includes the diamond layer section 120 integrated on, or against, the surface region of the GaN-based layer 110.

Figure 4:
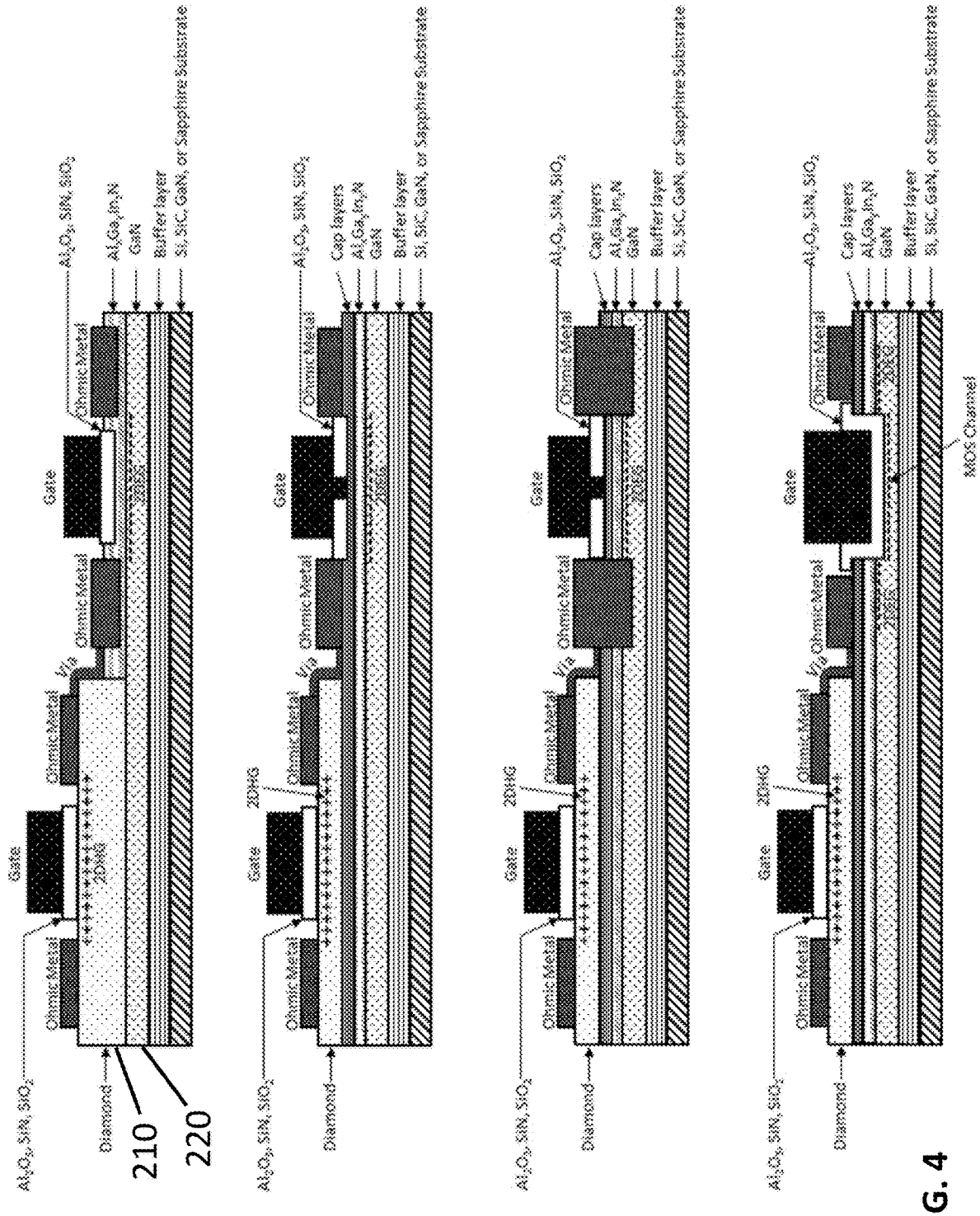
FIG. 4 is cross section diagram illustrating example diamond-on-GaN architectures, according to certain exemplary aspects of the present disclosure.

FIG. 4 is a set of cross-section diagrams showing of diamond-on-GaN IC constructed for implemented GaN-type HEMTs. Such GaN-type HEMTs leverage from lateral GaN HEMTs (aka heterojunction FETs or HFETs) demonstrating superior performance in comparison with Si-type devices, with GaN-type HEMTs particularly demonstrating high efficiency and/or high power density output for multiple applications. GaN HEMTs take the advantage of properties such as high-mobility 2-dimensional electron gas (2DEG) at the interface of AlGaN/GaN, where electrons move freely in a quantum well due to the presence of polarization charge. On the other hand, diamond exhibits the highest breakdown field (e.g., 10 MV/cm), has the largest thermal conductivity (>20 W/cm·K) of any of the wide-bandgap materials with a bandgap of about 5.45 eV, and can provide a high density 2-dimensional hole gas (2DHG) at the surface. Therefore, 2DHG from a hydrogen terminated diamond (hole-FET) can make a complementary logic with 2DEG from AlGaN/GaN HEMT. As illustrated, diamond 210 is integrated on top of a GaN HEMT structure 220 on a same substrate to provide the 2DHG.

Figure 5A:
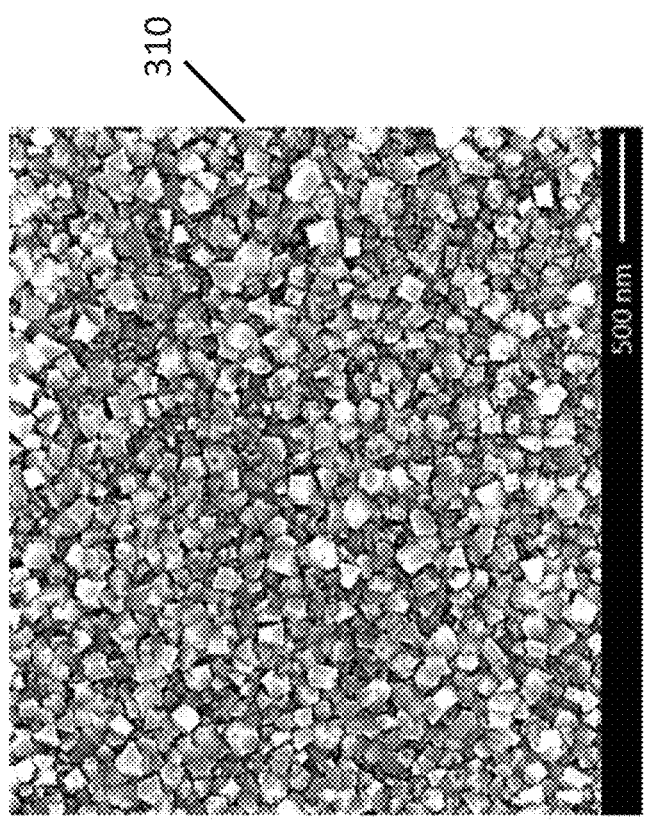
FIG. 5A is a top view illustrating an example polycrystalline diamond grown on top of GaN, according to certain exemplary aspects of the present disclosure.
Figure 5B:
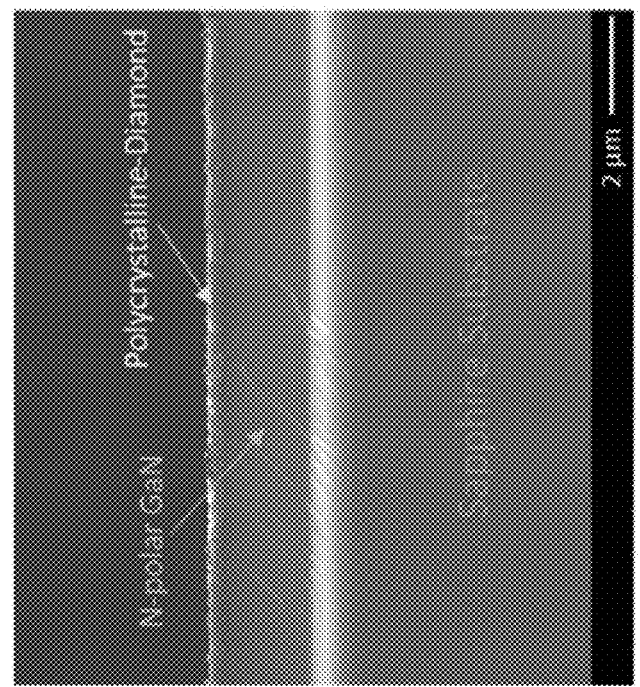
FIG. 5B is a cross-sectional view illustrating an example polycrystalline diamond grown on top of GaN, according to certain exemplary aspects of the present disclosure.

The top and cross-sectional view SEM micrographs of polycrystalline diamond-on-GaN are shown in FIG. 5A and FIG. 5B respectively. Diamond growth (310 and 320) may be done in a MPCVD (microwave plasma chemical vapor deposition) system, under a mixture of $H_2$ and $CH_4$ at around 650° C. As hydrogen plasma is the main species in diamond growth, it can damage the GaN layer 330 and change the properties of the 2-dimensional electron gas (2DEG). To overcome this issue, a polymer-assisted diamond nanoparticle seeding technique may be used prior to the growth, which works as the nucleation layer for diamond, and can protect the GaN 330 from extensive etching. The density of the nanoparticles after the seeding may be higher than $10^{12}$ $cm^{-2}$, which provides a uniform and complete coverage of the surface. Another method uses the protection layer (e.g., SiN on GaN) beside the seeding, to make sure there is no etching and good adhesion at the same time. For the growth part, a low power recipe (2% $CH_4/H_2$, ~650° C., 40 Torr, 1300 W microwave plasma, 1 hour) may be used to deposit an UNCD (ultra-nano crystalline diamond) layer for better contact to GaN 330, and then the temperature may be elevated (by microwave power or pressure) to increase the size of the grains.

Figure 6:
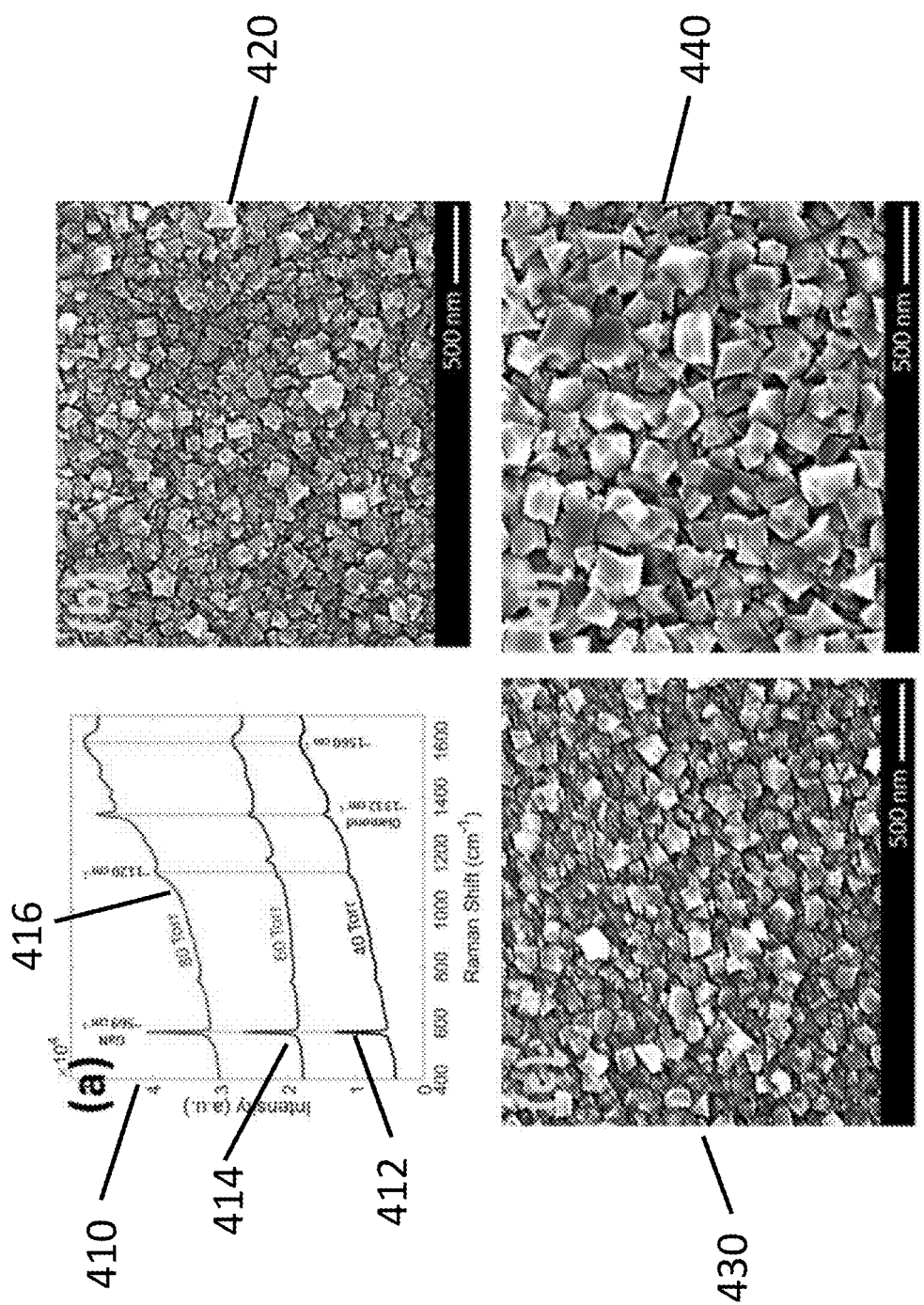
FIG. 6 is a Raman spectra graph and top view micrographs illustrating an example diamond-on-GaN growth method implemented at various pressures, according to certain exemplary aspects of the present disclosure.

FIG. 6 is a Raman spectra graph 410 and top view micrographs (420, 430, 440) illustrating diamond-on-GaN growth at various pressures. Diamond-on-GaN growth using 40 torr pressure is shown in 420 while its corresponding Raman spectra graph is illustrated as 412. Diamond-on-GaN growth using 60 torr pressure is shown in 430 while its corresponding Raman spectra graph is illustrated as 414. Diamond-on-GaN growth using 80 torr pressure is shown in 440 while its corresponding Raman spectra graph is illustrated as 416.

Figure 7B:
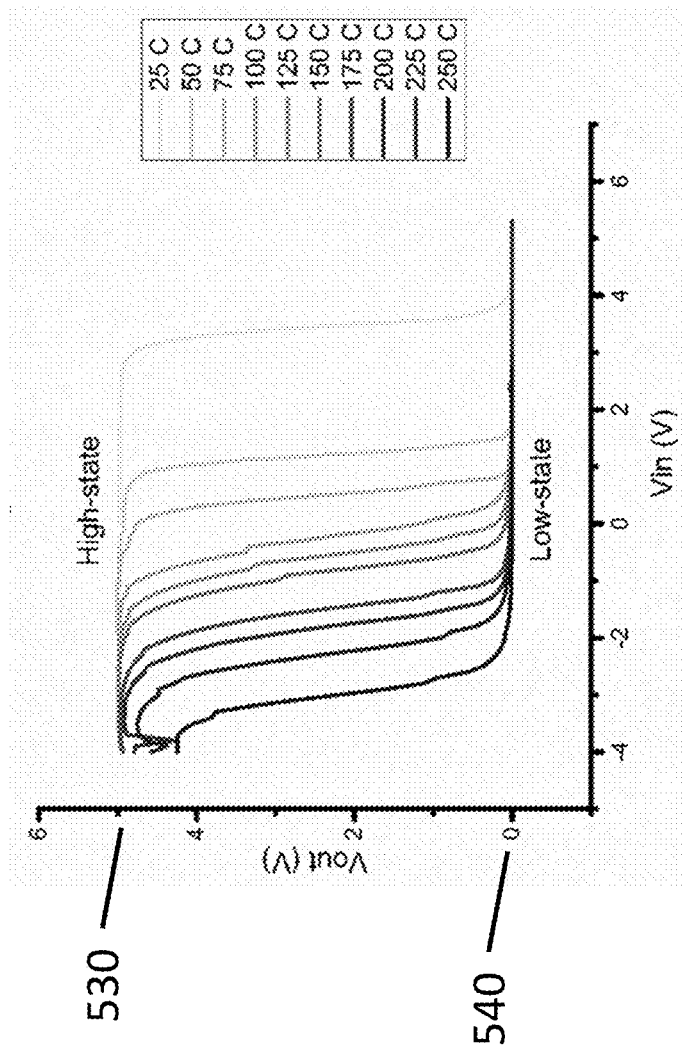
FIG. 7B is a graph illustrating the voltage transfer characteristics of an example complementary transistor based inverter according to certain exemplary aspects of the present disclosure.
Figure 7A:
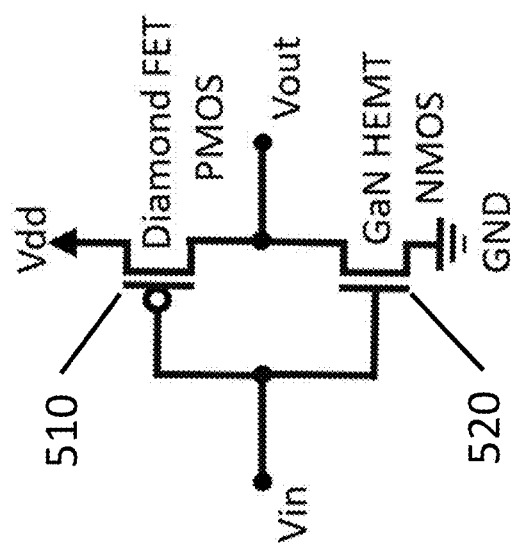
FIG. 7A is a circuit diagram illustrating an example CFET or CMOS inverter, according to certain exemplary aspects of the present disclosure.

FIG. 7A illustrates a (Complementary Transistor) CMI/OS inverter constructed with a Diamond-on-GaN architecture. Lack of high temperature (>150° C.) performance places a limit on silicon CMOS technology for modern applications. Wide-bandgap semiconductors, GaN and diamond, provide a more reliable solution for operation at higher temperatures. High temperature (up to 250° C.) voltage transfer characteristics of a "CMOS-like" inverter including a diamond Hole-FET as PMOS 510 and an AlGaN/GaN HEMT as NMOS 520 is shown in FIG. 7B. The PMOS 510 is fabricated from single crystal diamond with a 2DHG as conductive channel achieved by Hydrogen Plasma treatment at ~800° C. FIG. 7B shows that the complementary transistors completely reach high-state 530 (Vdd=+5 V) and low-state 540 (GND=0 V) with only 1 V on-off transition voltage. This performance may prove excellent potential in even higher operation temperature (~350C) in the future.

Figure 8A:
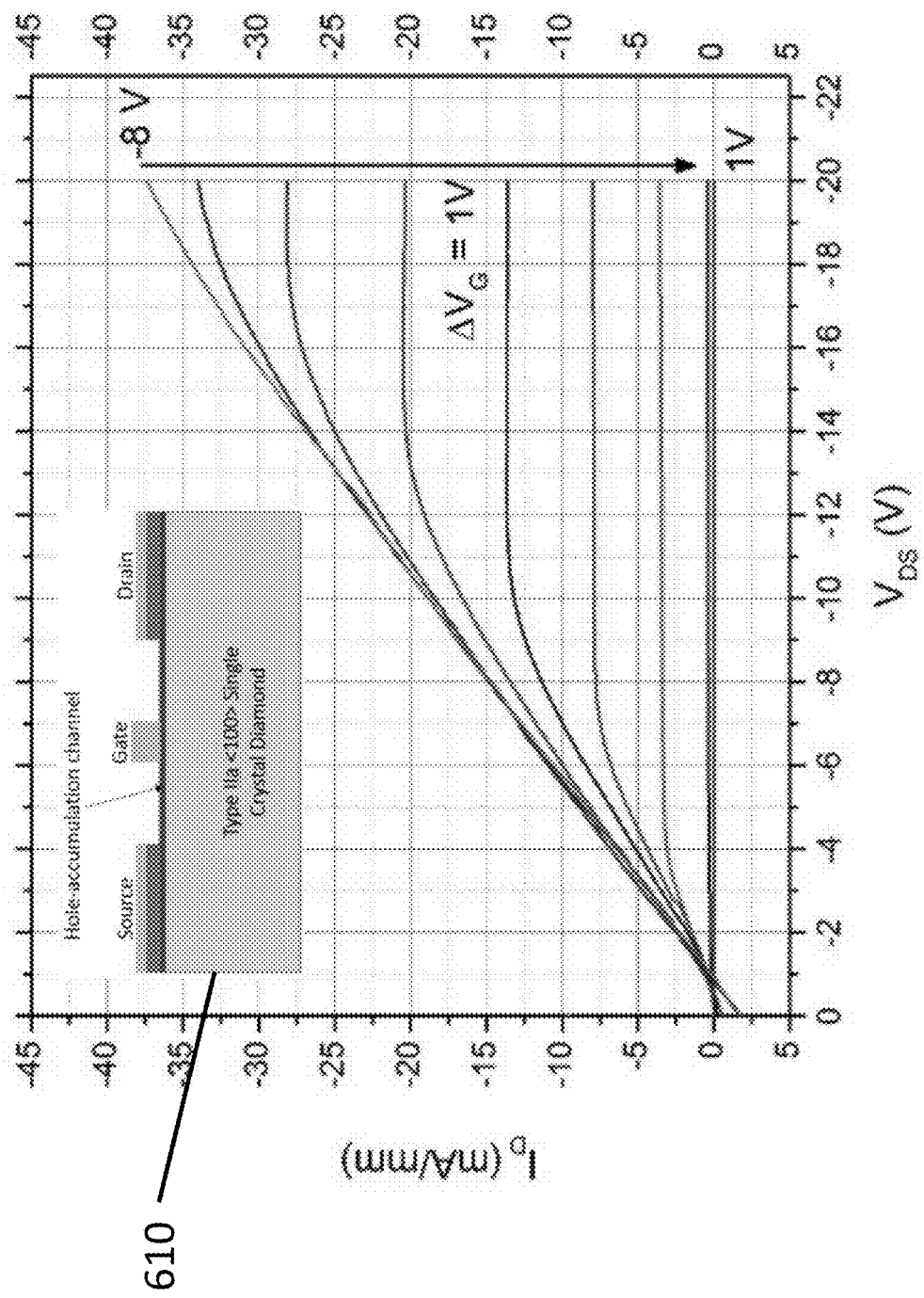
FIG. 8A is a graph illustrating the $I_D$ versus $V_{DS}$ characteristics of an example diamond FET (e.g., metal-semiconductor field-effect transistor type or MESFET) according to certain exemplary aspects of the present disclosure.

FIG. 8A is a graph illustrating the $I_D$ versus $V_{DS}$ characteristics of a MESFET constructed with a Diamond-on-GaN architecture. Typically, the diamond surface is oxygen-terminated after the growth. The 2D-hole gas formation enables the introduction of high-density holes without doping the material with hole mobility up to 200 $cm^2/Vs$.

The results of a "hole-FETs" (on single-crystalline diamond) include hole [Hall] mobility of 60 $cm^2/Vs$ and total current density of 40 mA/mm being recorded in the transistor with sub-threshold slope of 586 mV/decade and a transconductance of 5.2 mS/mm ID-VDS characteristics of the MESFET for VG varied from 1V to −8V with ΔVG=1V. A maximum current density of 37.2 mA/mm is obtained at VG=−8V for a VDS at −20V. Inset 610 illustrates H-terminated hole-accumulation-layer channel MESFET with Pd/Au source-drain and Al/Au gate, LG=2 μm.

Figure 8C:
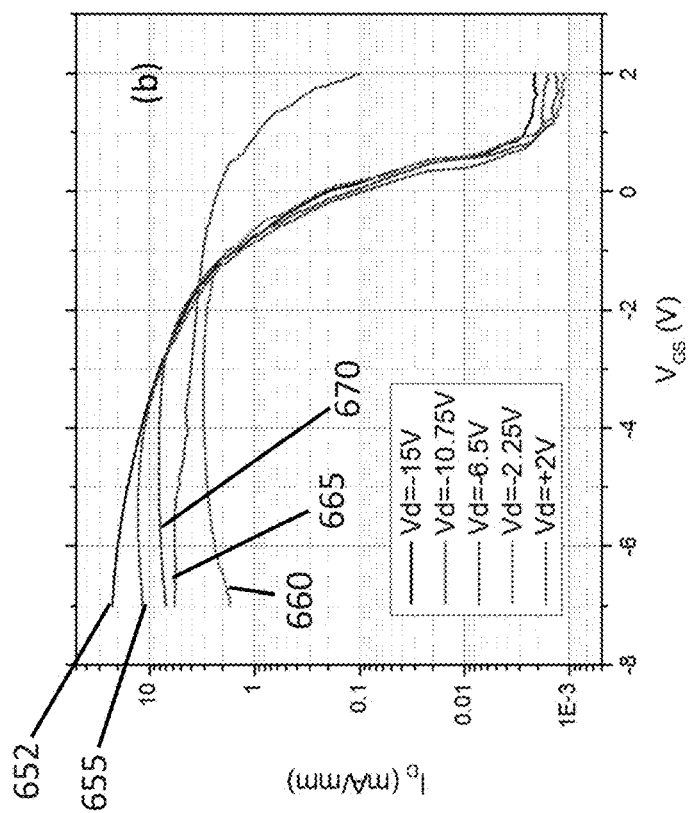
FIG. 8C is a graph illustrating $I_D$ versus gate bias ($V_{GS}$) characteristics of an example diamond MESFET according to certain exemplary aspects of the present disclosure.
Figure 8B:
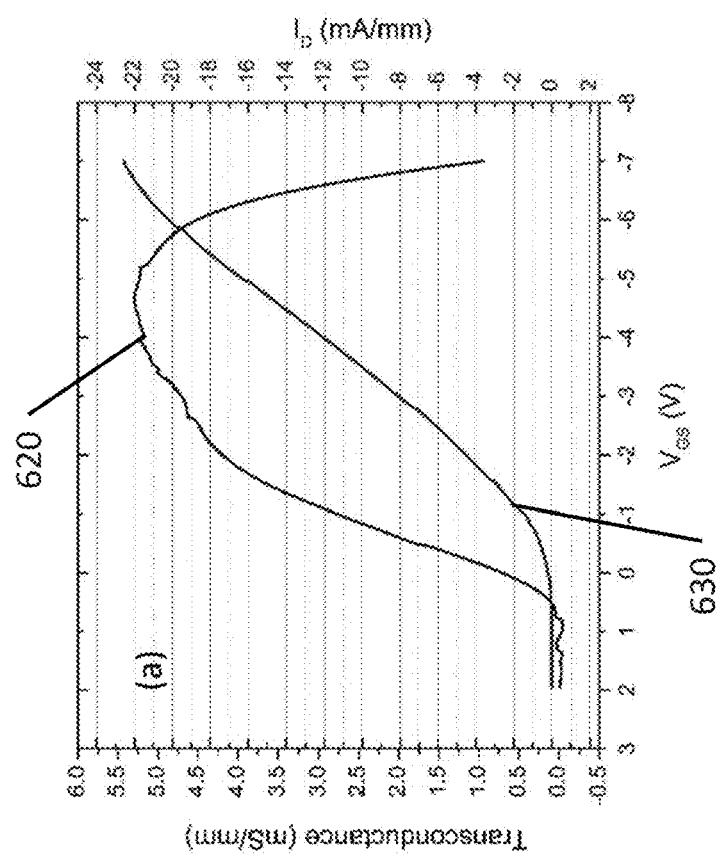
FIG. 8B is a graph illustrating the transconductance ($g_m$) versus gate bias ($V_{GS}$) characteristics of an example diamond MESFET according to certain exemplary aspects of the present disclosure.

The graphed aspects of FIG. 8B illustrate the gate bias dependent transconductance which is depicted as 620 with a maximum value of 5.2 mS/mm. A plot showing $I_D$ versus $V_{GS}$ is depicted as 630.

In FIG. 8C, the graphed aspects illustrate the ID-VGS characteristics of the MESFET for different VD varying from 2V to −15V. A typical subthreshold slope of 586 mV/dec is extracted from a linear fitting of the ID-VGS data and ID are shown for VDS=−15 V as at plot 652. Similarly, the other plots respectively correspond to VDS=−10.75 V at plot 655, VDS=−2.25 V at plot 660, VDS=+2 V at plot 665, and VDS=−6.5 V at plot 670.

Figure 8D:
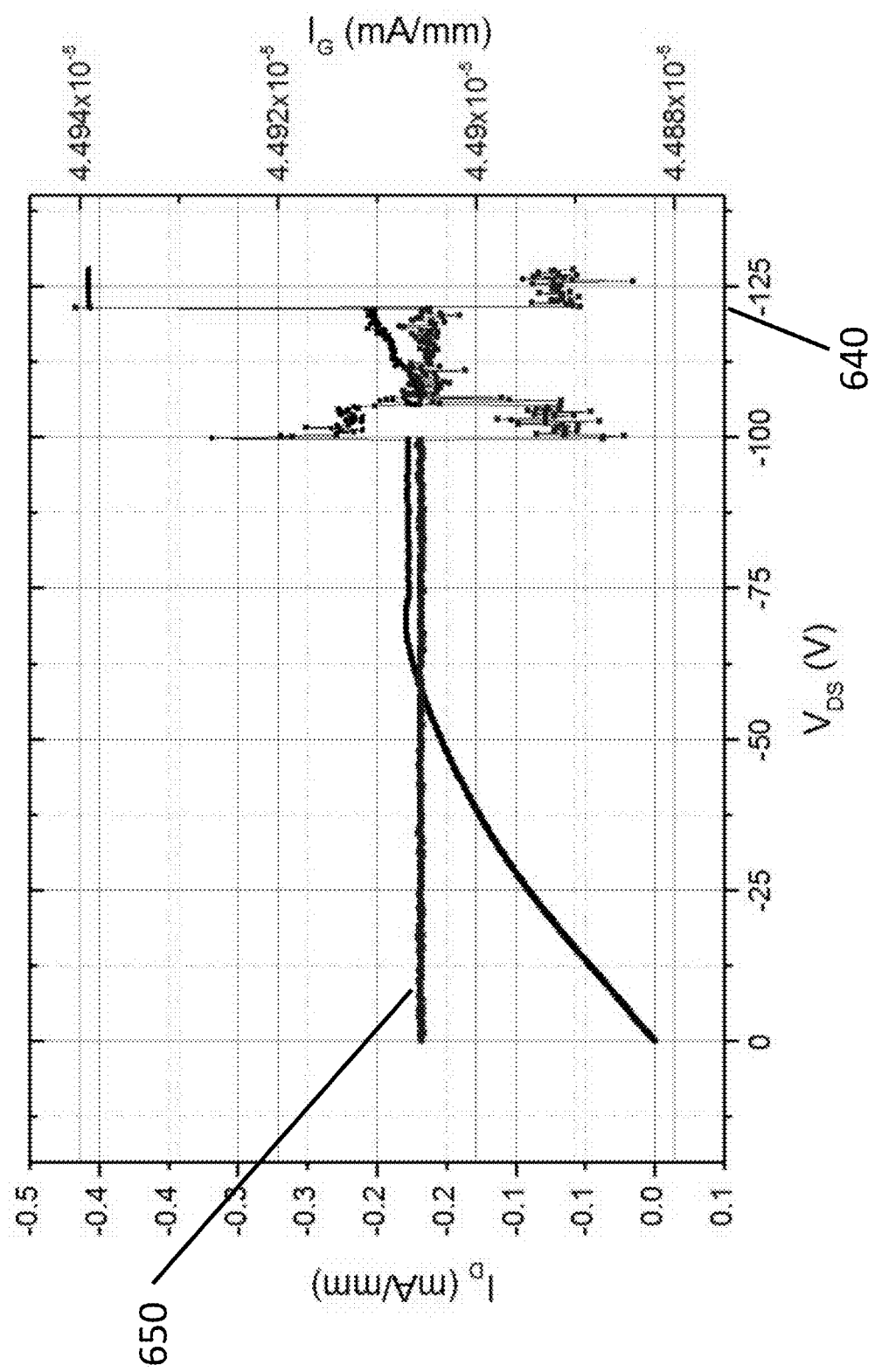
FIG. 8D is a graph illustrating $I_D$ versus $V_{DS}$ characteristics and the breakdown field of an example diamond MESFET according to certain exemplary aspects of the present disclosure.

Again, continuing with the above discussion, the graph of FIG. 8D illustrates the breakdown voltage 640 $V_{BR}$=−121 V which is obtained to give a breakdown field of −121 kV/cm. A low IG 650 value is maintained at $4.49 \times 10^{-8}$ mA/mm.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layer, layer portion, block, module, device, system, unit, controller, and/or other circuit-related depictions. Also, in connection with such descriptions, the term "source" may refer to source and/or drain interchangeably in the case of a transistor structure. Such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed:

1. A method comprising:
   forming
   a diamond layer section;
   a GaN-based substrate including GaN and AlGaN and including a dielectric layer; and
   forming an integrated circuit that includes
   a GaN-based field effect transistor (FET) integrated with a portion of the GaN-based substrate,
   a diamond-based FET ("diamond FET") integrated with a portion of the diamond layer section, the diamond FET being electrically coupled to the GaN-based FET and situated over or against a surface region of the GaN-based substrate, and
   interconnects to electrically interconnect the GaN-based FET and the diamond-based FET, wherein the dielectric layer is formed on the diamond layer section and the dielectric layer is to facilitate stability during operation of the integrated circuit at temperatures greater than 250° C. by at least one of: having a selected thickness to mitigate dielectric layer leakage current or breakdown of the dielectric layer; and being formed using a sufficiently-high deposition temperature of greater than 350° C.

2. The method of claim 1, wherein the AlGaN is characterized as $Al_xGa_yN$ (0<x<1; x+y=1), the GaN-based FET is an n-channel FET and the diamond FET is a p-channel diamond FET, and the diamond layer section is combined with the GaN-based substrate by bonding or by growing a PCD (polycrystalline diamond) over or against the surface region of the GaN-based substrate.

3. The method of claim 1, wherein the method further includes providing pressure-based control to form the diamond layer section with a targeted grain size of diamond particles which are grown through use of chemical vapor deposition (CVD).

4. The method of claim 1, wherein said forming an integrated circuit includes using a thermocompression-bonding method to bond respective portions of the diamond layer section and the GaN-based substrate, wherein the diamond layer section is formed without use of chemical vapor deposition (CVD).

5. The method of claim 1, wherein forming the dielectric layer includes using atomic-layer deposition (ALD) at a temperature in a range from 450° C. to 500° C., or using plasma-enhanced chemical vapor deposition (PECVD) at a temperature in a range not exceeding 500° C., and causing the dielectric layer to have a thickness, between the GaN-based substrate and the diamond layer section, in a range from 30 nm to 50 nm.

6. The method of claim 1, further including forming and interconnecting respective sets of contact pads for each of the GaN-based FET and the diamond FET, and wherein the GaN-based FET and the diamond FET are interconnected and configured to form a complementary FET.

7. The method of claim 1, wherein the method further includes a cooling process during growth of PCD (polycrystalline diamond) particles to form a PCD, and further includes controlling growth parameters of the PCD particles, wherein the controlled growth parameters include controlled pressure and controlled temperature to realize a targeted grain size of the PCD particles.

8. The method of claim 1, wherein controlled growth pressure and plasma power are applied to set a targeted grain size of PCD (polycrystalline diamond) particles in the diamond layer section, the targeted grain size corresponding to or associated with $sp^2$ and hydrogen content in the diamond layer section, and further including using the controlled growth pressure and plasma power for growing the PCD particles.

9. The method of claim 1, wherein the GaN-based FET is part of a circuit that includes a plurality of GaN-type FETs, and the method further includes using the diamond layer section to spread heat while the GaN-based FET and the diamond FET are being operated.

10. The method of claim 1, wherein the diamond-based FET and the GaN-based FET are interconnected by a monolithic integration process including: deposition and growth of PC diamond on the GaN-based substrate; fabricating the GaN-based FET on a portion of the GaN-based substrate not covered by the diamond layer section; and forming and interconnecting respective sets of contact pads for each of the GaN-based FET and the diamond FET.

11. The method of claim 10, further including etching a portion of the diamond layer section to provide the portion of the GaN-based substrate not covered by the diamond layer section.

12. The method of claim 1, wherein the GaN-based substrate has a first portion corresponding to the GaN-based substrate portion in which the GaN-based FET is contained or integrated and has a second portion corresponding to the surface region of the GaN-based substrate over or against which the diamond layer section is formed, the method further including using interconnecting contact pads of the diamond FET with contact pads of the GaN-based FET through use of a thermocompression process.

13. The method of claim 1, further including hydrogen-terminating the diamond FET and then forming and interconnecting respective sets of contact pads for each of the GaN-based FET and the diamond FET, and wherein the dielectric layer has a thickness in a range from 30 nm to 60 nm.

14. The method of claim 1, wherein the diamond layer section is polycrystalline in nature, and is grown from PCD (polycrystalline diamond) particles that are characterized as having a targeted grain size provided by controlling growth of the PCD particles, wherein the targeted grain size is within a range from 650 nanometers to 2.5 microns.

15. The method of claim 1, wherein the dielectric layer is formed using atomic-layer deposition with the sufficiently-high deposition temperature being in a range from 450° C. to 500° C.

16. An apparatus comprising:
a GaN-based substrate including GaN and AlGaN and including a dielectric layer;
a diamond layer section that is single- or poly-crystalline in nature; and
an integrated circuit that includes
a GaN-based field effect transistor (FET) integrated with a portion of the GaN-based substrate, and
a diamond FET integrated with a portion of the diamond layer section, the diamond FET being electrically coupled to the GaN-based FET by interconnects and situated over or against a surface region of the GaN-based substrate, the dielectric layer being formed on the diamond layer section and the dielectric layer to facilitate stability during operation of the integrated circuit at temperatures greater than 250° C. by at least one of: having a selected thickness to mitigate dielectric layer leakage current or breakdown of the dielectric layer; and being formed using a sufficiently-high deposition temperature of greater than 350° C.

17. The apparatus of claim 16, wherein the GaN-based FET is part of a circuit that includes a plurality of GaN-type FETs, and wherein the diamond layer section is to spread heat while the GaN-based FET and the diamond FET are being operated, and wherein the dielectric layer has a thickness in a range from 30 nm to 60 nm.

18. The apparatus of claim 16, wherein the diamond FET and the GaN-based FET are monolithically integrated and have respective sets of contact pads interconnected, and wherein the diamond layer section is polycrystalline in nature.

19. The apparatus of claim 16, wherein the diamond FET is a p-channel diamond FET and the GaN-based FET is an n-channel GaN-based HEMT (high-electron-mobility transistor).

20. The apparatus of claim 16, wherein the GaN-based FET and the diamond FET are cooperatively configured to provide a complementary FET (C-FET) in which the GaN-based FET is an n-channel HEMT (high-electron-mobility transistor) and the diamond FET is a p-channel FET.

21. The apparatus of claim 16, wherein the integrated circuit includes at least one diamond FET and at least one of a MESFET (metal—semiconductor field-effect transistor) and a HEMT (high-electron-mobility transistor).

22. The apparatus of claim 16, wherein the GaN-based substrate has a first portion corresponding to the GaN-based substrate portion in which the GaN-based FET is contained or integrated and has a second portion corresponding to the surface region of the GaN-based substrate over or against which the diamond layer section is situated, and the first portion and the second portion are of a commonly-formed wafer die.

23. The apparatus of claim 16, wherein the GaN-based substrate has a first portion corresponding to the GaN-based substrate portion in which the GaN-based FET is contained or integrated and has a second portion corresponding to the surface region of the GaN-based substrate over or against which the diamond layer section is situated, and the first portion and the second portion correspond to separately-formed wafer dice.

24. The apparatus of claim 16, wherein a portion of the diamond layer section is etched.

25. The apparatus of claim 16, wherein the dielectric layer is characterized as having electrons transferred from a diamond conduction band.

* * * * *